United States Patent [19]
Akamatsu

[11] Patent Number: 4,491,742
[45] Date of Patent: Jan. 1, 1985

[54] SEMICONDUCTOR SWITCH DEVICE
[75] Inventor: Masahiko Akamatsu, Amagasaki, Japan
[73] Assignee: Mitsubishi Denki Kabushiki Kaisha, Tokyo, Japan
[21] Appl. No.: 436,359
[22] Filed: Oct. 25, 1982

Related U.S. Application Data

[63] Continuation of Ser. No. 45,660, Jun. 5, 1979, abandoned, which is a continuation of Ser. No. 818,064, Jun. 22, 1977, abandoned, which is a continuation of Ser. No. 677,753, Apr. 16, 1976, abandoned.

[30] Foreign Application Priority Data
Jun. 18, 1975 [JP] Japan .................. 50-74688

[51] Int. Cl.³ ............... H03K 17/72; H03K 17/04; H03K 17/60
[52] U.S. Cl. ............... 307/252 C; 307/252 M; 307/305; 307/353; 357/38; 357/46
[58] Field of Search .......... 307/252 C, 252 J, 252 M, 307/305, 353, 284; 357/38, 39, 46, 86

[56] References Cited
U.S. PATENT DOCUMENTS

| | | | |
|---|---|---|---|
| 3,131,311 | 4/1964 | Ross | 357/38 |
| 3,303,360 | 2/1967 | Gentry | 307/252 C |
| 3,694,670 | 9/1972 | Marzolf | 307/252 M |
| 3,938,027 | 2/1976 | Iwamoto | 307/252 M |

Primary Examiner—John Zazworsky
Attorney, Agent, or Firm—Oblon, Fisher, Spivak, McClelland & Maier

[57] ABSTRACT

A self-turn-off type semiconductor switch comprising a gate-reverse biasing thyristor and a transistor connected in parallel to each other wherein the load current is shunted to the transistor, thus causing the thyristor to be turned off.

4 Claims, 19 Drawing Figures

SEMICONDUCTOR SWITCH DEVICE

CROSS-REFERENCE TO RELATED APPLICATIONS

This application is a continuation of Ser. No. 045,660, filed June 5, 1979, now abandoned, which was a continuation of Ser. No. 818,064, filed June 22, 1977, now abandoned, which was a continuation of Ser. No. 677,753, filed Apr. 16, 1976, now abandoned.

BACKGROUND OF THE INVENTION

1. Field of the Invention

The present invention relates to semiconductor switch devices, and more particularly to semiconductor switch devices of the type comprising a thyristor and a transistor in combination.

2. Description of the Prior Art

Prior art power transistors give rise to a large voltage drop in the large current region, resulting in low capacity to withstand a peak surge current. Prior art thyristors also are not very practical in that it is difficult to turn them off through the control electrode and their turn-off means are intricate. Further, with prior art gate turn-off thyristors, it has been difficult to obtain switching element to large current capacity. This is because gate-reverse-biasing at turn-off induces current concentration and hot-spots in a region separated from the gate.

SUMMARY OF THE INVENTION

It is therefore an object of the invention to provide a semiconductor switch device comprising a gate-reserve-biasing thyristor and a transistor in combination wherein the voltage drop in the large current region is reduced and turn-off in the thyristor is facilitated.

BRIEF DESCRIPTION OF THE DRAWINGS

In FIGS. 1 through 8, like constituent components are indicated by identical references.

DETAILED DESCRIPTION OF THE PREFERRED EMBODIMENTS

Figure 1:
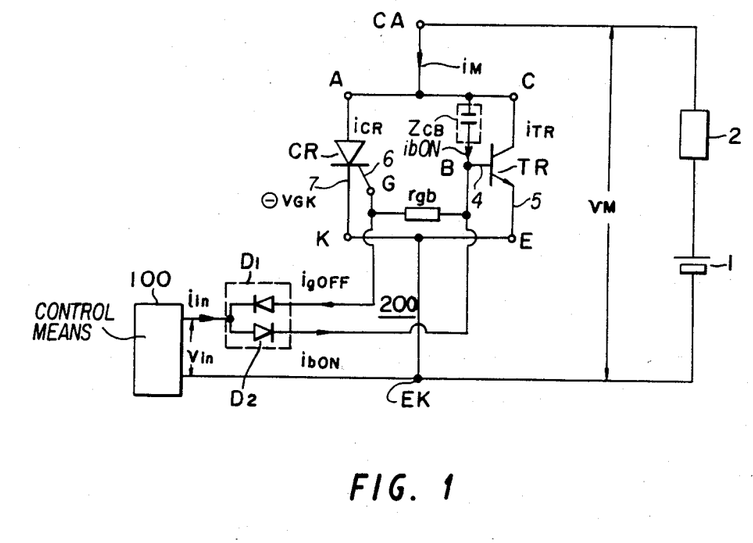
FIG. 1 is a circuit diagram showing one embodiment of the invention.

Referring to FIG. 1, the reference CR denotes a gate-reverse-biasing thyristor, TR a transistor, 1 and 2 power circuits to be controlled, such as a power source and a load, 100 a control means for controlling the gate electrode G of the thyristor CR or the base electrode B of the transistor TR, and rgb a voltage drop element which may be a linear or nonlinear impedance element such as a resistance or inductance element, which is inserted between the gate electrode G and the base electrode B. The voltage drop element rgb may be included in a semiconductor device in the manner as will be described later. The references $D_1$ and $D_2$ denote diodes which, together with the voltage drop element rgb, form a connecting means 200. The anode A and the cathode K of the thyristor CR are connected to the collector and the emitter, respectively, of the transistor TR, thereby forming a parallel connection.

Figure 2A:
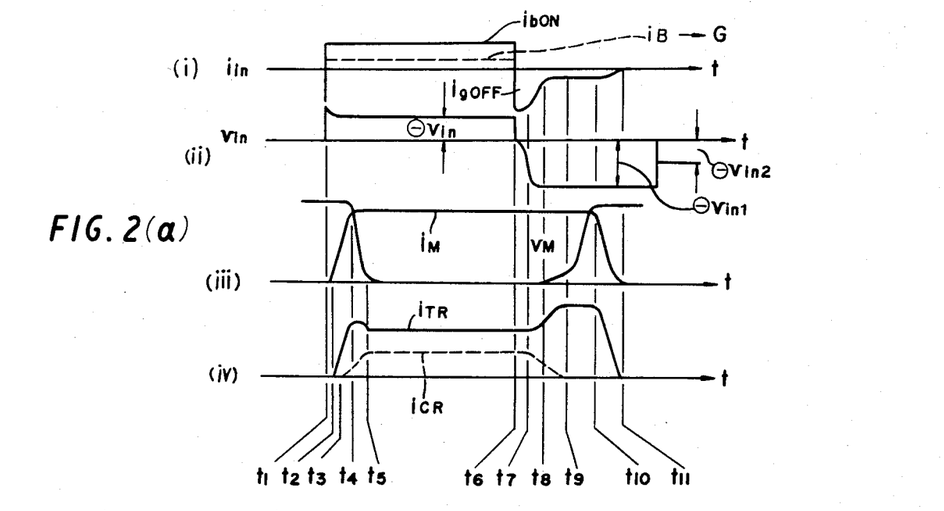
FIG. 2(a) is a waveform diagram for illustrating control operation of FIG. 1.

In FIG. 1, assure that a control current $i_{in}$ and a control voltage $v_{in}$ are applied as in FIG. 2(a)(i) and (ii). When the current $i_{in}$ is positive, this current flows as a base current $i_{bON}$ to the base electrode of the transistor TR through the diode $D_2$. Part of the current goes to the gate of the thyristor CR through the voltage drop element rgb. The transistor TR and the thyristor CR are turned on by the base current $i_{bON}$ and the gate current $i_{B \to G}$ to allow the main current $i_M$ to flow, causing the switch voltage $V_M$ to be lowered. This turn-on operation takes place at timings $t_1$ to $t_5$ as indicated by (iii) and (iv) in FIG. 2(a). The ratio of currents shared by the transistor and the thyristor depends on the value of the impedance element rgb, the ratio of the current capacities of the thyristor and the transistor (especially the ratio of the area of the gate layer to that of the base layer), and other factors. At timings $t_5$ and $t_6$, the transistor TR and the thyristor CR are in the ON state respectively, and share the main current $i_M$. When the main current $i_M$ is small and the base current is insufficient in the transistor TR, the main current is shared at a higher ratio by the transistor then by the thyristor. When the main current reaches approximately the maximum rated value, the main current is shared by the transistor and the thyristor at a ratio of the wafer areas of the two semiconductor elements. When the main current becomes still larger, the base current becomes insufficient in the transistor, and the ratio $i_{CR}/i_{TR}$ at which the main current is shared by the thyristor and the transistor increases. At the arrival of a large surge current, most of it goes to the thyristor, that is, the ratio $i_{CR}/i_{TR}$ further increases. In the large current region, the voltage across the thyristor gate and the cathode rises and the current flows in the base B of the transistor through the resistor rgb (between the gate and the base) and the diodes $D_1$ and $D_2$. By this reciprocal process, the transistor is supplied with its base current from the thyristor whereby the current conducting performance of the transistor TR in the large current region is improved.

To turn off the switch device, a negative control voltage $\theta V_{in}$ is applied from the control means 100. By this voltage, the gate of the thyristor is reversely biased through the diode $D_1$, causing a reverse biasing current $i_{gOFF}$ to flow. The thyristor CR is constructed so that the reverse bias potential through the gate electrode affects the entire gate layer (or P doped base $P_B$ layer in $P_E N_B P_B N_E$ and P gate thyristors). In the beginning, the voltage across the thyristor gate and the cathode is kept low due to the internal impedance of the control means 100 and the release of carriers stored in the thyristor. During this period, a large reverse biasing current $i_{gOFF}$ flows. The current $i_{gOFF}$ starts decreasing as carrier release from the thyristor progresses. As a result, the reverse voltage $\theta V_{GK}$ between the gate and the cathode of the thyristor increases. With further progress of carrier release from the thyristor, the thyristor current $i_{CR}$ is cut off. This thyristor turn-off process takes place at timings $t_6$ to $t_9$.

At this stage of operation, the transistor does not yet release its stored carriers because reverse biasing is limited by the resistance rgb or delayed due to a delayed rise in the voltage $V_{GK}$. Accordingly, the whole of the main current $i_M$ including the current $i_{CR}$ which has been flowing in the thyristor is directed to the side of transistor TR.

This current shunting occurs at timings $t_7$ to $t_9$ as shown in FIG. 2(a). By this one-sided current shunting to the transistor, carriers are released from the transistor, and the base-reverse-biasing current through the impedance element rgb due to rise in the reverse voltage $\theta V_{GK}$ (between the gate and the cathode) increases. These operations urge the release of the stored carriers from the transistor, causing the voltage $V_M$ between the main electrodes CA and EK. Therefore, the main current $i_M$ decreases and the transistor current is cut off. This transistor turn-off process takes place at timings $t_9$ to $t_{11}$ as in FIG. 2(a).

FIG. 1 exemplifies a circuit in which the base electrode B and the gate electrode G are controlled by a control means comprising a pair of terminals. Alternatively, the two electrodes may be controlled independently. The control means 100 can be simplified by employing paired control terminals as shown in FIG. 1. This control means is particularly useful when the electrodes are controlled through an isolating means. Further, this type of control means can readily be packaged with a transistor TR, a thyristor CR, diodes $D_1$ and $D_2$, an impedance element rgb, etc., into an integrated circuit.

According to the invention, as shown in FIG. 1, a capacitive impedance element $Z_{CB}$ may be installed between the collector and the base of the transistor TR. This arrangement will improve the effect of elongating the voltage rise time during the turn-off operation by base current $i'_{bon}$ forming through the capacitive impedance element $Z_{CB}$. This improvement permits the foregoing turn-off operation to be duly performed even when the pulsed base-turn-on current $i_{bON}$ is insufficient or even without supplying the current $i_{bON}$ externally.

Figure 2B:
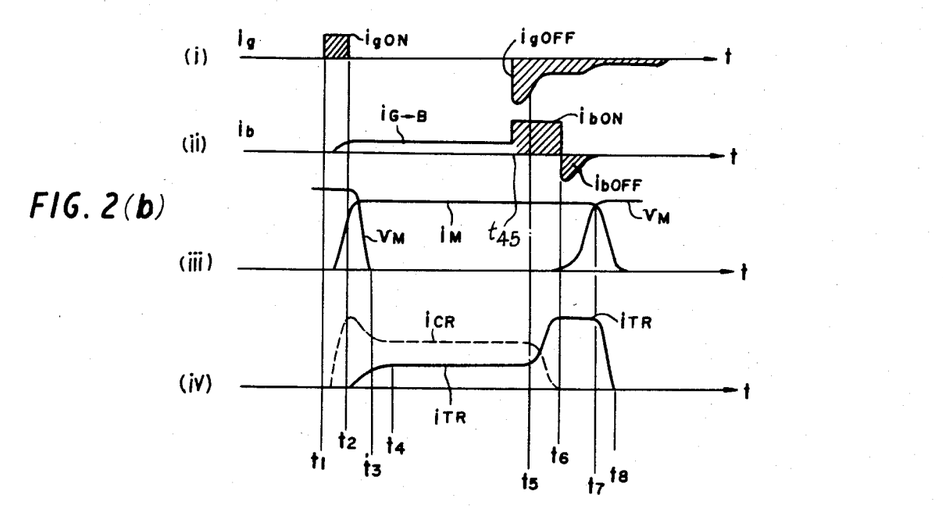
FIG. 2(b) is a waveform diagram for illustrating another control method according to the invention.

FIG. 2(b) is a diagram illustrating the operation of another switching circuit wherein the thyristor is turned on by the thyristor gate current and turned off by reversely biasing the thyristor gate and supplying a pulse current to the transistor base and then reversely biasing the transistor base.

More specifically, the gate current $i_{gON}$ is supplied to the thyristor CR in a pulse form to turn on the thyristor whereby the main current flows. When a resistance element rgb (between the gate and the base) is installed, a current $i_{G \to B}$ flows by the voltage $V_{GK}$ (between the gate and the cathode) due to the thyristor main current. The current $i_{G \to B}$ flows as the base current $i_b$ of the transistor TR, causing the transistor to be turned on to a certain extent. The transistor is further turned on when the value of the resistance rgb is chosen lower and the thyristor current becomes larger. This effect serves to slightly delay the rise in the current $i_{CR}$ in the thyristor.

At turn-off at time $t_{45}$, a gate reverse biasing current $i_{gOFF}$ is supplied to the thyristor and a forward base current $i_{bON}$ is supplied to the transistor whereby the main current $i_M$ is shunted to the transistor. The thyristor CR is turned off while the main current is shunted to the transistor. After this operation, the transistor base current is cut off or the transistor base is reversely biased to turn off the transistor.

The invention makes other switching control modes available beside what has been described above. These control modes are commonly characterized by the following points. The transistor and the thyristor are connected in parallel to each other whereby the capacity of the thyristor to share the current is enhanced in the large current region and thus the overall voltage drop is reduced. In other words, the forward voltage drop in the large current region becomes smaller than when it depends upon the transistor alone, even in view of the overall mean current density, i.e. the total current divided by the total area of the semiconductor wafers. Accordingly, the capacity to withstand a peak surge current can be increased.

Furthermore, in the turn-off operation, the thyristor gate is reversely biased before the transistor is not fully turned off, thereby permitting the thyristor current to be reduced beforehand. As a result, the rise in the turn-off reapplying voltage seen by the side of the thyristor is suppressed and thus the thyristor turn-off is facilitated. In other words, the shunting the main current to the transistor, the turn-off switching power for the thyristor is reduced and the gate turn-off current is increased.

Furthermore, the semiconductor wafer is effectively utilized because the current in its steady state is shared by the thyristor and the transistor.

It is desirable that the ratio of the rated current $I_{CR}$ of the thyristor CR to the rated current $I_{TR}$ of the transistor TR in terms of continuous DC current conduction be 1:0.3 to 10. When $\bar{I}_{TR}/\bar{I}_{CR} \geqq 0.3$, the thyristor is essentially operated to be sufficient for turning off the rated current $I_{CR} = 1$. When $\bar{I}_{TR}/\bar{I}_{CR} \geqq 10$, the transistor is essentially operated so that the peak surge current capacity can be made considerably larger than in the transistor alone. The above rated current ratio is considered to be approximately the ratio of the areas of the two semiconductor wafers which occupy the integrated semiconductor structure.

FIG. 3 schematically illustrates the constructional features of a composite semiconductor element embodying the invention. FIG. 3(b) shows the second surface (back surface) of the wafer seen by the side of emitter and cathode thereof wherein $N_E$ denotes the third and seventh semiconductor layers (commonly connected semiconductor layers) of a first conductivity type, which are the exposed surfaces of the emitter and cathode layers respectively. An emitter contact (third contact) 5 and a cathode contact (sixth contact) 7 serve as a common electrode in contact therewith and are connected to the second main current terminal EK. The reference $P_B$ denotes the second and sixth semiconductor layers (commonly connected semiconductor layers) of a second conductivity type, which are the exposed surfaces of the base and gate layers. A base contact (second contact) 4 and a gate contract (fifth contact) 6 serve as a common electrode in contact therewith and are connected to the common control terminal GB. FIG. 3(a) is a sectional view taken across X—X of FIG. 3(b). In FIG. 3(a), the transistor part comprises: a first semiconductor layer (collector layer) $N_C$ of a first conductivity type, which has its exposed surface in the first region on the first surface and comes into ohmic contact with a collector contact (first contact) 3 connected to the first main current terminal CA; a second semiconductor layer (base layer) $P_{BB}$ of a second conductivity type, which has its exposed surface on the second surface; and a third semiconductor layer (emitter layer) $N_{EE}$ (the first region of $N_E$) of a first conductivity type, which has its exposed surface on the second surface. The thyristor part comprises: a fourth semiconductor layer (anode layer) $P_E$ of a second conductivity type, which has its exposed surface in the second region on the first surface and comes into contact with an anode contact 3 (fourth contact commonly connected to the first contact 3) connected to the first main current terminal CA; a fifth semiconductor layer $N_B$ (continued to the collector layer $N_C$) of a first conductivity type; a sixth semiconductor layer (gate layer) $P_{BG}$ of a second conductivity type, which has its exposed surface on the second surface; and a seventh semiconductor layer (cathode layer) $N_{EK}$ of a first conductivity type, which has its exposed surface on the second surface.

This semiconductor device may be fabricated by known techniques such as alloy, diffusion, and epitaxial growth techniques.

Figure 3A:
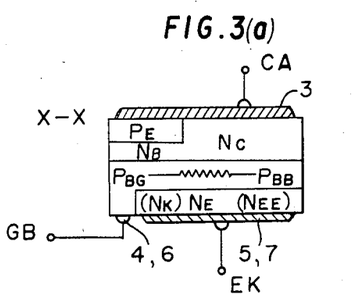
FIGS. 3 to 5 are schematic conceptual diagrams showing constructional features of semiconductor device embodying the invention.
Figure 3B:
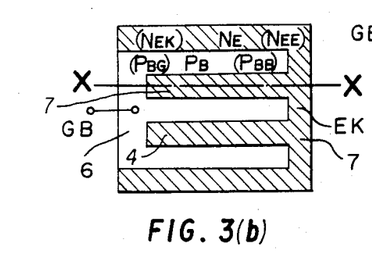
Figure 3C:
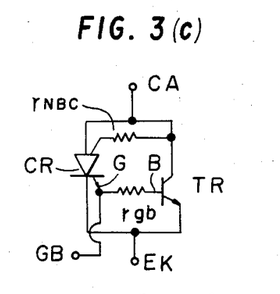
Figure 3D:
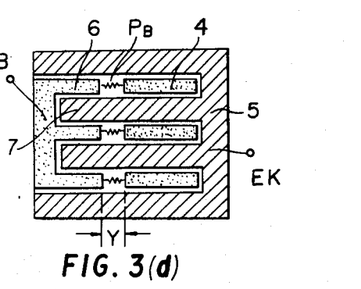

FIG. 3(c) shows an equivalent circuit of the foregoing semiconductor device comprising the gate and base contacts 4 and 6 of thin film resistance (spread resistance). When the contacts 4 and 6 are of thick film, the two contacts are split as indicated by the contact pattern in FIG. 3(d), to allow the control current to be introduced into the $P_B$ layer. To this end, strip resistors 10 to 30 microns thick are installed across the cut portions Y of the $P_B$ layer. By this arrangement, a resistance rgb of the desired value is set between the gate region $P_{BG}$ and the base region $P_{BB}$.

In the beginning of the turn-on operation, turn-on comes from the gate side of the thyristor, and the base current is supplied to the transistor from part of the thyristor, and the base current is supplied to the transistor from part of the thyristor anode current shunted to the gate and from part of the control current. Turn-off operation is carried out in the same manner as in FIGS. 1 and 2(a).

Figure 4:
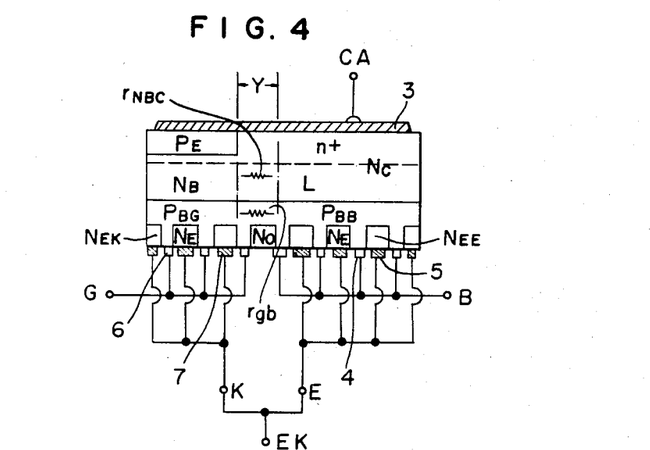

FIG. 4 schematically illustrates an improved semiconductor switch device embodying the invention, wherein a split region Y is disposed between the fourth and third layers of the thyristor. The aim of this arrangement is to prevent carriers from being injected and diffused into the base layer $N_B$ on the side of thyristor anode and thus to improve the turn-off (current cut-off) characteristics of the thyristor region. In other words, the split region Y serves to limit the phenomenon whereby the collector current passing through the resistance $r_{NBC}$ which opposes the spread of carriers, as well as through the layers $P_E$-$N_B$-$P_{BB}$, is shunted by convolution. Also, carrier diffusion into the layer $N_B$ ascribed to carrier recombination in the $r_{NBC}$ region can be prevented.

An open emitter (or partial short emitter) $N_O$ may be installed in the region between the thyristor cathode layer and the transistor emitter layer. This will permit the resistance rgb between the gate layer $P_{BG}$ and the base layer $P_{BB}$ to be adjusted to the desired value.

The effect of separation between the thyristor part and the transistor part can be enhanced by setting the resistance rgb to be as high as possible. When this approach is employed for the purpose of increasing the turn-off limit current, the thyristor and the transistor can be controlled independently as in FIG. 2(b). While, when the above arrangement is used for the purpose of reducing or eliminating the base current supply to the transistor (such base current being constantly supplied to maintain the transistor conducting), it is necessary to insert externally a low resistance, a diode or other suitable element into the circuit between the thyristor gate and the transistor base. In this manner, the operating characteristics of the switch device can be modified according to the application.

The cathode terminal K and the emitter terminal E may be led out separately. This arrangement will permit a necessary circuit means to be connected between the two terminals whereby the overall circuit characteristics may be suitably modified. For instance, by an auxiliary pulse voltage applied so that the side K assumes a positive potential and the side E a negative potential at the turn-off operation, it becomes possible to improve the turn-off characteristics. This auxiliary pulse voltage may be obtained from a pulse transformer or a mutual inductance-coupling inductance element or the like installed between the cathode terminal K and the emitter terminal E. This is done without disturbing the ordinary conducting current in the circuit.

Figure 5:
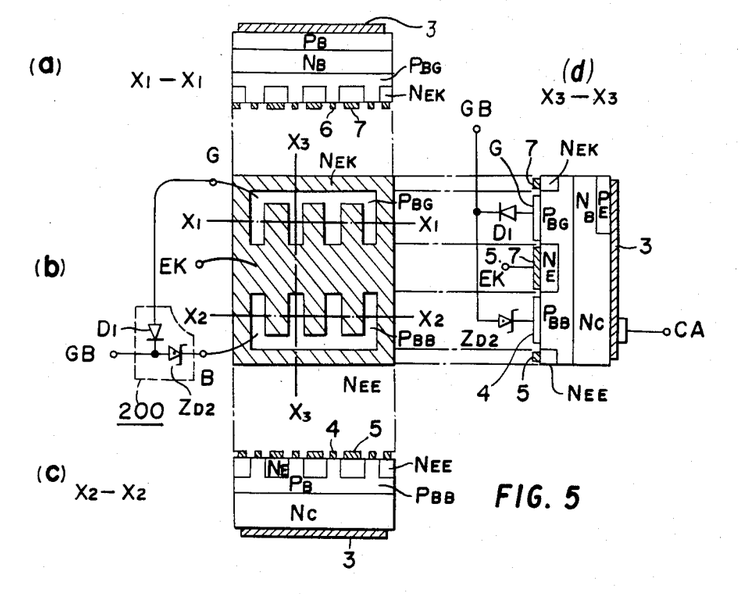

FIG. 5 schematically illustrates a semiconductor device of another embodiment of the invention; FIG. 5(b) is a back view showing a pattern of exposed surfaces of $P_B$ layer ($P_{BG}$, $P_{BB}$) and $N_E$ layer ($N_{EK}$, $N_{EE}$), with no contacts shown, FIG. 5(a) is a cross-sectional view through $X_1$—$X_1$ of the thyristor region, FIG. 5(c) is a cross-sectional view through $X_2$—$X_2$ of the transistor region, and FIG. 5(d) is a cross-sectional view through $X_3$—$X_3$ over the two thyristor and transistor regions. An emitter contact 5 and a cathode contact 7 are integrally formed and connected to the second main current terminal EK. A base contact 4 is connected to the control terminal GB through a zener diode $ZD_2$, and a gate contact 6 is connected to the control terminal GB through a diode $D_1$. The diodes $D_1$ and $ZD_2$ may be installed in position by soldering or bonding a diode semiconductor pellet to the contact surface. The diode $ZD_2$ does not turn on in the beginning of the turn-off operation (as in FIG. 1) where the reverse voltage between the gate and the cathode of the thyristor is low (due to carrier release from the thyristor). When the reverse voltage between the gate and the cathode thereof rises at the end of carrier release from the thyristor, the zener diode $ZD_2$ turns on to cause the transistor base-emitter to be reversely biased. Thus transistor reverse-biasing is securely preceded by thyristor turn-off whereby an optimum turn-off sequence is maintained.

Figure 6A:
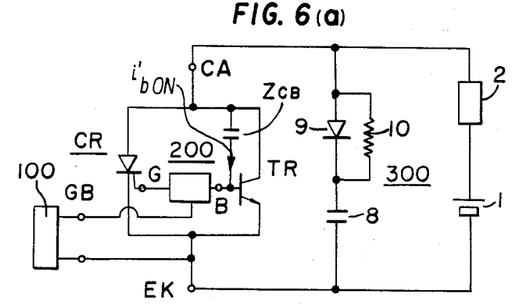
FIGS. 6(a) and 6(b) are a circuit diagram and a graphic diagram, respectively, showing features of improved semiconductor devices of the invention.
Figure 6B:
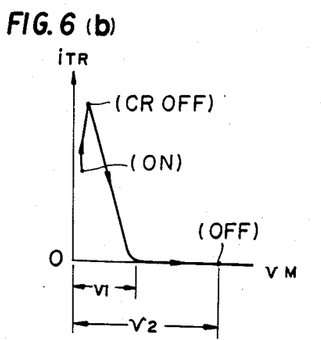
Figure 6C:
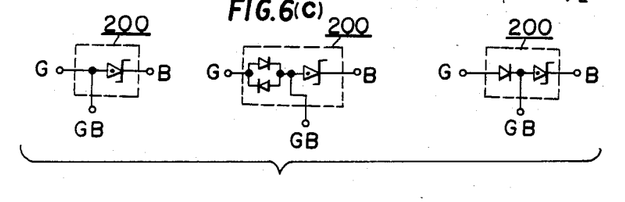

FIG. 6 schematically illustrates improvements of the semiconductor switch device of the invention, wherein a circuit network means 200 between the gate of the thyristor and the base of the transistor is preferably of such circuit elements as $D_1$, $D_2$ and rgb of FIG. 1, rgb of FIG. 3 or 4, $D_1$ and $ZD_2$ of FIG. 5, (i), (ii) or (iii) of FIG. 6(c), or the like. These circuit elements serve to suitably distribute the turn-on and turn-off control current and voltage to the gate and the base thereof. For this control, a pair of control terminals will suffice.

In FIG. 6, the reference numeral 300 denotes an external reapplying voltage suppressing means which comprises, for example, a diode 9, a resistor 10, and a capacitor 8, and reduces the turn-off switching power for the transistor TR. As shown in FIG. 6(b) of the turn-off resurge diagram plotted for the current $i_{TR}$ in relation to the voltage $V_M$, the transistor cut-off point voltage $V_1$ at the transistor current $i_{TR}$ (equal to the total current $i_M$ at turn-off) is controlled below the final OFF voltage $V_2$ at the transition from the normal ON state point (ON) to the full cut-off point (OFF) by way of the thyristor cut-off point (CR OFF). This operation makes it possible to turn off a current or a voltage so large that it would not be turned off by the transistor alone. Thus, according to the invention, a current or a voltage far exceeding the turn-off limit for the gate-reverse-biasing turn-on thyristor CR can be turned off.

FIG. 7 schematically illustrates another switching control method and the construction of semiconductor devices of the invention. FIG. 7(a) is a control circuit diagram wherein, at the turn-on operation, control currents are supplied to the gate and the base thereof from a voltage $V_{ON}$ through a switch $S_{ON}$ by way of a diode $D_3$ and a resistor $r_g$ and by way of a diode $D_4$ and a resistor $r_b$, respectively. When the thyristor is essentially operated whereby the main current is shared by the thyristor, a voltage $V'_{ON}$ is applied through a switch $S'_{ON}$, to the thyristor gate, as shown in FIG. 7(b). In this case, a turn-on gate current is supplied to the thyristor part due to the base-emitter breakover characteristic (zener diode characteristic) of the transistor.

At the turn-off operation, a voltage $V_{OFF}$ is applied between the gate and the base through a switch $S_{OFF}$, causing a forward bias to be effected at the transistor base, and a reverse bias to be effected at the thyristor gate.

Figure 7A:
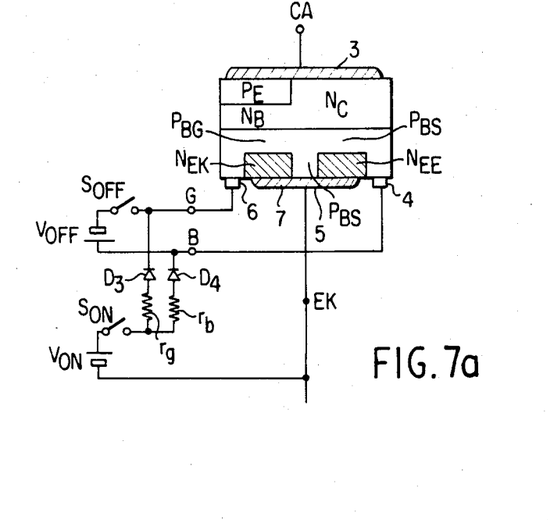
FIGS. 7(a) to 7(e) are schematic diagrams showing features of improved semiconductor devices of the invention.
Figure 7B:
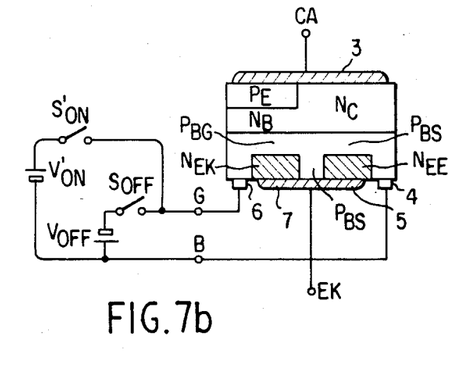
Figure 7C:
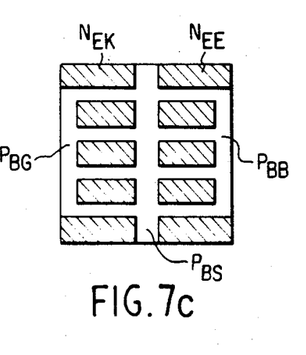
Figure 7D:
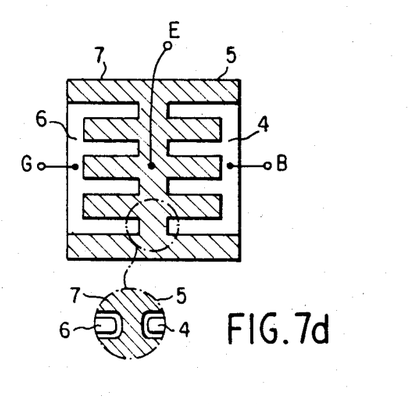

This semiconductor device comprises a $P_B$ layer for effecting a split between the thyristor part and the transistor part, and a $P_{BS}$ layer connected to emitter contacts 5 and 7. FIG. 7(c) is a back view of a pattern of exposed surfaces of the semiconductor layers, and FIG. 7(d) shows a pattern of contacts 4 to 7 corresponding to the pattern shown in FIG. 7(c). The exposed surface $P_{BS}$ of the split region $P_B$ as in FIG. 7(c) comes into ohmic contact with the emitter-cathode contacts 5 and 7 as shown in FIG. 7(d).

Figure 7E:
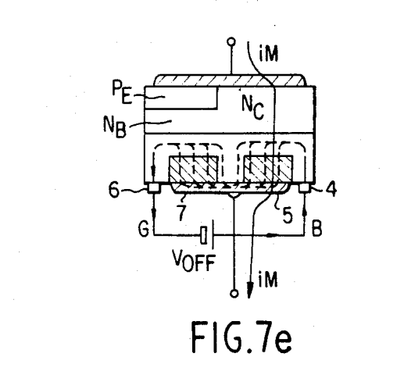

At the turn-off operation, the switch device operates as in FIG. 7(e) wherein the control current flows along the loop in the arrow-marked direction: G-$V_{OFF}$-B-$P_{BB}$-$N_{EE}$ (5,7)-$N_{EK}$-$P_{BG}$-G as indicated by the dotted line. In this operation, the control current passes the contacts 5 and 7, because the thicknesses of the $P_B$ ($P_{BB}$, $P_{BG}$, $P_{BS}$) layer and the $N_E$ ($N_{EE}$, $N_{EK}$) layer are considerably smaller than the widths of the strip patterns as in FIGS. 7(c) and 7(d). For example, in FIG. 7(e), the laterally spread resistance is far higher than the longitudinal resistance.

This switch device is operated in the same manner as in FIG. 2(b) for turn-off operation. The thyristor part is gate-biased and the transistor part is made fully conducting by the current attributed to carriers released from the thyristor as the result of its gate biasing. The main current $i_M$ can then be directed to the transistor part as indicated by the solid-line arrow in FIG. 7(e). With the progress in carrier release from the thyristor and in cut-off of the thyristor, the transistor base current decreases and the potential at the transistor part rises. Then, finally, the main current is cut off. Thereafter, the switch $S_{OFF}$ is closed to cut the control current. This brings the turn-off operation to an end.

Thus, by supplying a turn-off control current between the gate and the base, the thyristor turn-off and the supply of the pulse base-current for shunting the main current to the transistor are done simultaneously in an automatic process.

In the foregoing embodiments, the combination of a P type gate thyristor and an NPN type transistor is employed. Alternatively, an N type gate thyristor and a PNP type transistor may be used in combination. Further, an N type gate thyristor and an NPN type transistor may be used in combination, or a P type gate thyristor and a PNP type transistor may be used in combination. Any of these combinations can be formed on a semiconductor wafer. For example, an N type gate thyristor and a PNP type transistor are formed in combination on the individual semiconductor layers whose conductivity types are reverse to each other. An N type gate thyristor and an NPN type transistor are formed in combination in such a manner that the $N_B$ layer is exposed on the anode side in parallel to the $P_E$ layer, and an N gate electrode is installed. A P type gate thyristor and a PNP type transistor are formed in combination in such a manner that a $P_{EE}$ layer (on the same level as the thyristor $P_E$ layer) is installed, instead of the $N_{EE}$ layer, on the $N_C$ side, and this $N_C$ layer is exposed as the base layer wherein a base contact is disposed. Also, a P gate and an N gate can be used in parallel.

In FIG. 4, a small distribution part (a short emitter on the anode side) of the $N_B$ layer, which is extended through the $P_E$ layer and is short-circuited to the anode contact, or a small distribution part (a short emitter on the cathode side) of the $P_{BG}$ layer, which is extended through the $N_{EK}$ layer and is short-circuited to the cathode contact, may be installed in the thyristor part. By this arrangement, the turn-off characteristic and voltage blocking characteristic can be improved.

As shown in FIG. 4, the $N_C$ layer and the $N_B$ layer may be divided into a high resistivity layer and a low resistivity layer $n^+$.

Figure 8A:
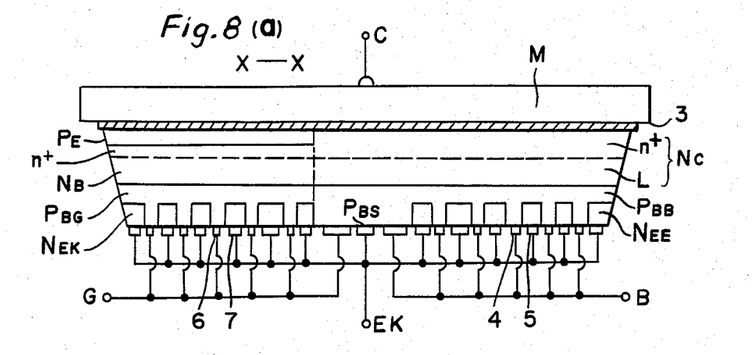
FIGS. 8(a) and 8(b) are schematic diagrams showing another embodiment of the invention.
Figure 8B:
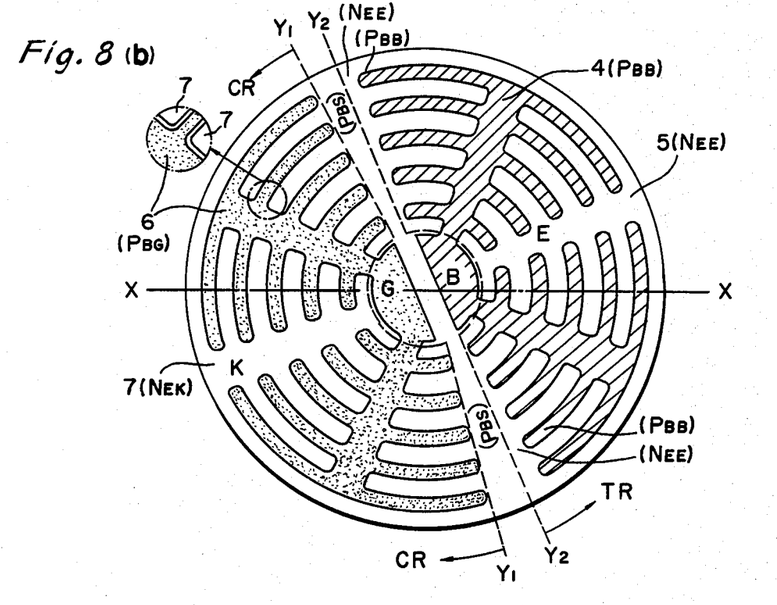

FIG. 8 schematically illustrates another embodiment of the invention, which is suited for applications to a large power semiconductor switch device for a flat package. FIG. 8(b) is a plan pattern view of the second surface (bottom) wherein the boundary between contacts is shown by an enlarged diagram in a circle. The cathode contact surface K and the emitter contact surface E are linked together by a common contact and are brought into contact with the $N_{EK}$ and $N_{EE}$ layers in the back. The gate contact surface G and the base contact surface B are divided and are brought into contact with the $P_{BG}$ and $P_{BB}$ layers beneath their exposed surfaces. A $P_E$ layer is formed on the first surface (top surface) to the left of the first boundary line (dotted line $Y_1$—$Y_1$) between the thyristor part and the transistor part. An exposed surface of the split region of the $P_B$ layer is present between the second boundary line ($Y_2$—$Y_2$) and the first boundary line ($Y_1$—$Y_1$) and makes ohmic contact with the cathode-emitter contacts 5 and 7, thereby forming a short emitter splitting region. The exposed surface of the $P_{BS}$ layer is the exposed $P_B$ layer continuous to the $P_{BG}$ layer on the gate contact G. The exposed surface of the $P_{BB}$ layer on the base contact B is continuous to the exposed surface of the $P_B$ layer only in the small circle portion of the center part. That is, there is an exposed surface of the $N_{EE}$ layer on the emitter contact 5 to the right of the second boundary line ($Y_2$—$Y_2$). The semiconductor layers covered under these contact surface are indicated by brackets ().

In the above construction, the base and the gate may be led out by means of point contact or by soldering. The emitter and the cathode may be led out by means of an intermediary conductor spacer of the same plane pattern or by point contact.

According to the invention, as has been described hereinbefore, a transistor and a gate-reverse biasing thyristor are used in the form of parallel combination, wherein turn-off operation of this switch device is facilitated by gate reverse biasing. Thus, this switch device can be operated as a power semiconductor switch capable of being turned off by a control electrode. Therefore, according to the invention, large current elements can readily be realized. In this semiconductor switch device, in comparison with that constituted by a transistor alone having self-turn-off ability, the voltage drop in the large current region can readily be reduced. In other words, the peak surge current can be increased in the device of the invention. Furthermore, large current elements can be obtained more easily by the device of the invention than by a device constituted by a gate-turn-off thyristor alone.

One noteworthy feature of the invention is that the thyristor is gate-reversely biased, causing the main current to be shunted to the transistor, with the result that the voltage or current for the gate turn-off operation is reduced in the thyristor.

Furthermore, a thyristor and a transistor are formed in combination on the same semiconductor wafer for various switching applications. These two semiconductor elements in combination can be accommodated in the same package, which simplifies the associated circuit device.

Still further, by installing a connecting means 200 between the base of the transistor and the gate of the thyristor, the switching controllability can be enhanced. Further, by applying a control voltage between the thyristor gate and the transistor base, the efficiency of the current shunt from the thyristor to the transistor can be improved.

I claim:

1. A semiconductor switch device comprising:
    a transistor having a base and main electrodes, the main electrodes of the transistor including a collector and an emitter;
    a thyristor having a gate and main electrodes, the electrodes of the thyristor including and an anode and a cathode;
    a power path for carrying current from a source to said anode;
    said main electrodes of said transistor and said main electrodes of said thyristor being connected in parallel in the same direction;
    resistor means connecting the base of the transistor to the gate of the thyristor;
    forward biased voltage means including a first diode means connected to said resistor means for applying to said resistor means a forward biased voltage to turn-on said transistor and said thyristor; and
    reversed biased voltage means including a second diode means connected to said resistor mean for applying a reversed biased voltage to turn off said thyristor and said transistor;
    whereby said transistor reduces and absorbs the turn-off switching power of said thyristor.

2. A semiconductor switch as in claim 1, including:
    a capacitive impedance connected between the collector and the base of the transistor.

3. A semiconductor switch device as in claim 1, including:
    an external re-applying voltage suppressing means connected between the collector and the emitter of the transistor.

4. A semiconductor switch device as in claim 3, wherein:
    the external re-applying voltage suppressing means comprises a diode and a resistor connected in parallel to form a parallel circuit and a capacitor connected in series to the parallel circuit.

* * * * *